(12) United States Patent
Yoon et al.

(10) Patent No.: US 9,710,335 B2
(45) Date of Patent: Jul. 18, 2017

(54) VERSIONED MEMORY IMPLEMENTATION

(71) Applicant: Hewlett Packard Enterprise Development LP, Houston, TX (US)

(72) Inventors: Doe Hyun Yoon, Palo Alto, CA (US); Terence P. Kelly, Palo Alto, CA (US); Jichuan Chang, Palo Alto, CA (US); Naveen Muralimanohar, Palo Alto, CA (US); Robert Schreiber, Palo Alto, CA (US); Parthasarathy Ranganathan, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 41 days.

(21) Appl. No.: 14/785,421

(22) PCT Filed: Jul. 31, 2013

(86) PCT No.: PCT/US2013/053098
§ 371 (c)(1),
(2) Date: Oct. 19, 2015

(87) PCT Pub. No.: WO2015/016926
PCT Pub. Date: Feb. 5, 2015

(65) Prior Publication Data
US 2016/0077922 A1 Mar. 17, 2016

(51) Int. Cl.
*G06F 13/00* (2006.01)
*G06F 11/14* (2006.01)
(Continued)

(52) U.S. Cl.
CPC ...... *G06F 11/1451* (2013.01); *G06F 11/1072* (2013.01); *G06F 11/1435* (2013.01); *G06F 11/1471* (2013.01); *G11C 29/52* (2013.01);

*G06F 3/0614* (2013.01); *G06F 3/0628* (2013.01); *G06F 2201/84* (2013.01)

(58) Field of Classification Search
CPC ............ G06F 11/1451; G06F 11/1072; G06F 11/1435; G06F 11/1471; G06F 2201/84; G06F 3/0614; G06F 3/0628; G11C 29/52
USPC ...... 711/162, 165, 172; 710/23, 36, 55, 120; 712/225, 228; 714/48, 52, 54, 758, 819
See application file for complete search history.

(56) References Cited

U.S. PATENT DOCUMENTS 7,861,122 B2   12/2010   Cornwell et al.
7,872,911 B2   1/2011    Sarin et al.
(Continued)

OTHER PUBLICATIONS

International Searching Authority, The International Search Report and the Written Opinion, Apr. 30, 2014, 10 Pages.

*Primary Examiner* — Reba I Elmore
(74) *Attorney, Agent, or Firm* — Mannava & Kang, P.C.

(57) ABSTRACT

According to an example, versioned memory implementation may include comparing a global memory version to a block memory version. The global memory version may correspond to a plurality of memory blocks, and the block memory version may correspond to one of the plurality of memory blocks. A subblock-bit-vector (SBV) corresponding to a plurality of subblocks of the one of the plurality of memory blocks may be evaluated. Based on the comparison and the evaluation, a determination may be made as to which level in a cell of one of the plurality of subblocks of the one of the plurality of memory blocks checkpoint data is stored.

15 Claims, 14 Drawing Sheets

(51) Int. Cl.
    *G06F 11/10*     (2006.01)
    *G11C 29/52*     (2006.01)
    *G06F 3/06*     (2006.01)

(56) References Cited

U.S. PATENT DOCUMENTS

| | | |
|---|---|---|
| 2008/0059834 A1 | 3/2008 | Erstad |
| 2008/0134196 A1 | 6/2008 | Madriles et al. |
| 2009/0187785 A1 | 7/2009 | Gonzalez et al. |
| 2010/0031116 A1* | 2/2010 | Yoon .................. H03M 13/116 |
| | | 714/752 |
| 2011/0113208 A1 | 5/2011 | Jouppu et al. |
| 2011/0119526 A1 | 5/2011 | Blumrich et al. |
| 2012/0011398 A1 | 1/2012 | Eckhardt et al. |
| 2013/0121075 A1 | 5/2013 | Hutchison et al. |

\* cited by examiner

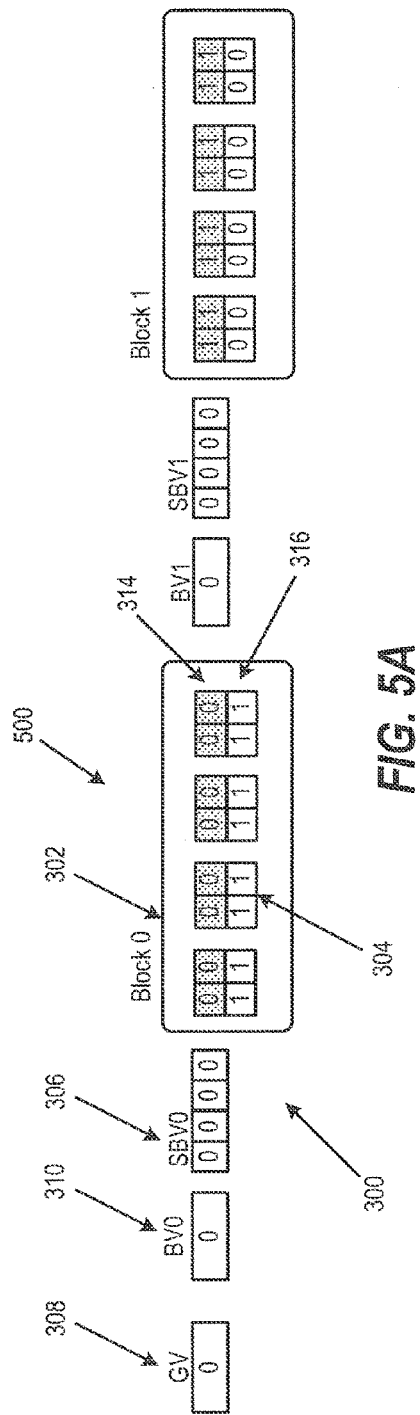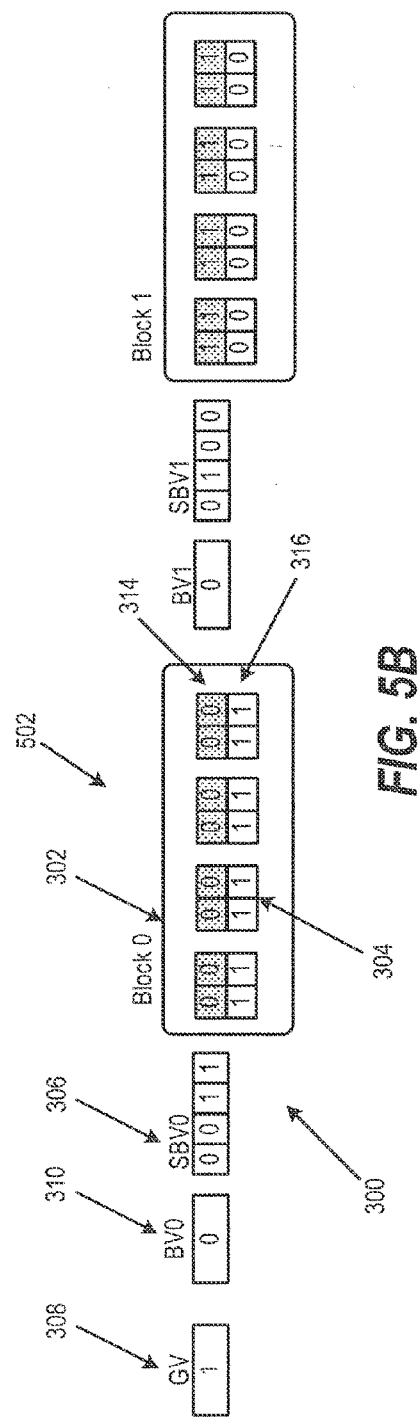
FIG. 5A
FIG. 5B

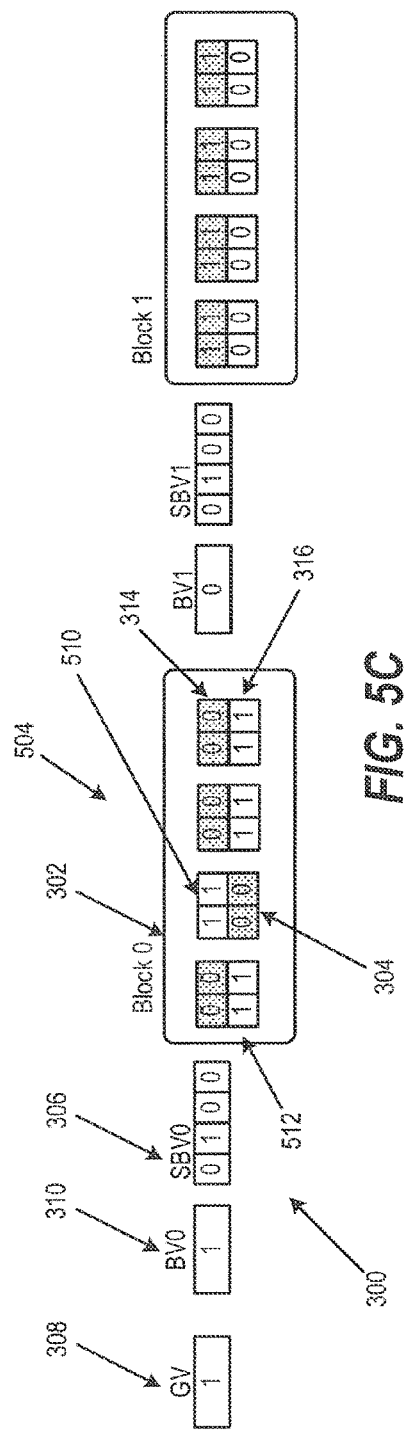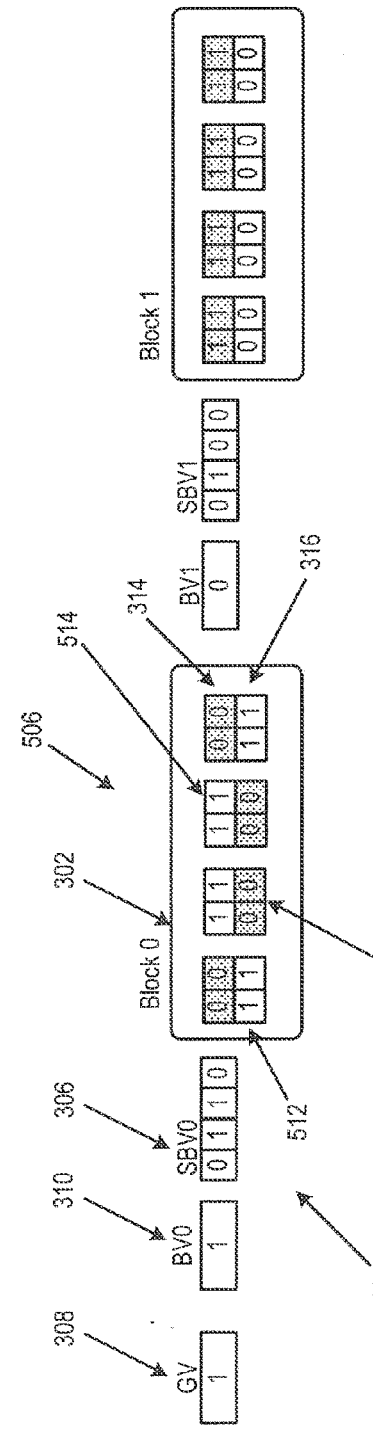

VERSIONED MEMORY IMPLEMENTATION

BACKGROUND

Checkpointing is a fault olerance technique in computing systems. Checkpointing typically includes storing a snapshot of a current application or system state, for example, by copying memory to a secondary location to generate a memory version, and using the memory version at a later time for re-executing the application in the event of failure. For example, a calculation process may use checkpoints to store memory versions of calculated data at various points during the calculation process. In the event of an application or system failure, the calculation process can become corrupted and/or generate inconsistent results. To avoid having to restart the calculation process, the memory version corresponding to the latest checkpoint prior to application or system failure is restored, and the calculation process is continued from the restored checkpoint.

BRIEF DESCRIPTION OF DRAWINGS

Features of the present disclosure are illustrated by way of example and not limited in the following figure(s), in which like numerals indicate like elements, in which:

FIGS. 5A-5E illustrate block diagrams of memory states during computations using the checkpointing configuration of FIG. 3, according to an example of the present disclosure;

DETAILED DESCRIPTION

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

As described in further detail below, a versioned memory implementation apparatus, a method for versioned memory implementation, and a non-transitory computer readable medium disclosed herein generally relate to implementation of a versioned memory system that allows software (i.e., machine readable instructions) to rapidly copy data to a secondary location so as to create a memory version, and to rapidly restore data from the memory version to a current version.

Figure 1:
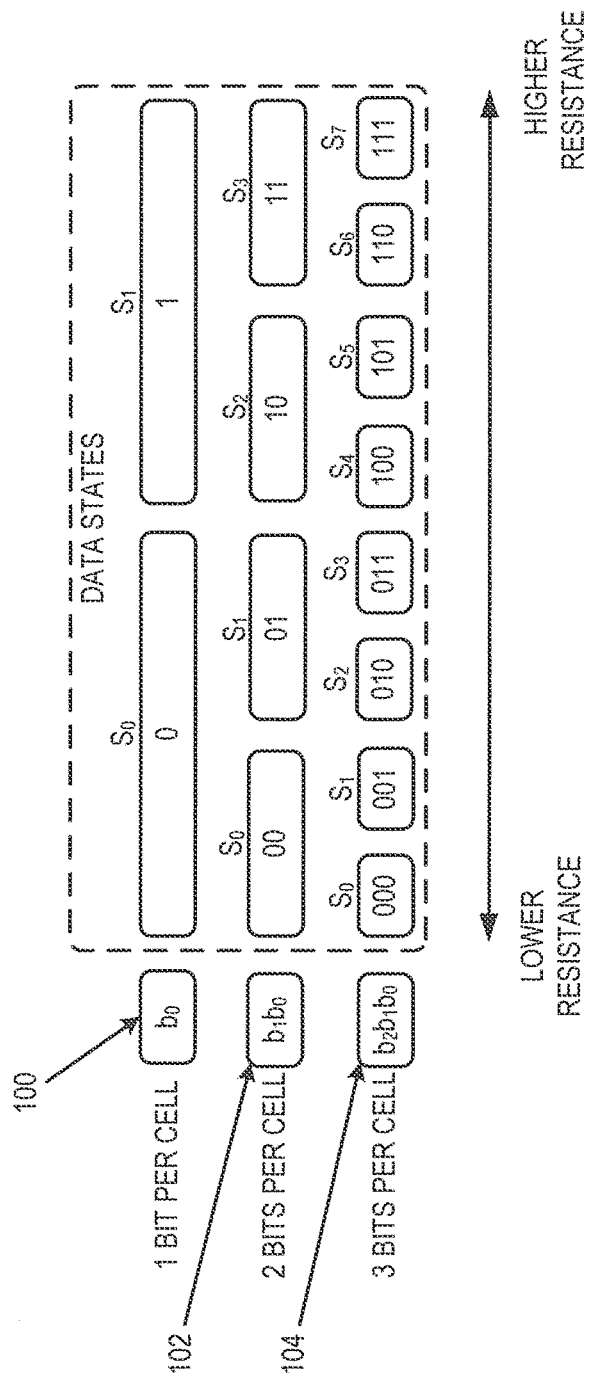
FIG. 1 illustrates examples of 1-bit cell (hereinafter "2LC"), 2-bit cell (hereinafter "4LC"), and 3-bit cell (hereinafter "8LC") non-volatile memory (NVM) configurations, according to an example of the present disclosure.

With respect to versioned memory, FIG. 1 illustrates examples of 1-bit cell (hereinafter "2LC"), 2-bit cell (hereinafter "4LC"), and 3-bit cell (hereinafter "8LC") non-volatile memory (NVM) configurations, respectively, at 100, 102, and 104, according to an example of the present disclosure. The 2LC 100 may store one bit per cell and use a first range of resistance (e.g., low resistance values) to represent a Boolean '0' (e.g., state $S_0$) and a second range of resistance (e.g., high resistance values) to represent a Boolean '1' (e.g., state $S_1$). The 4LC 102 and 8LC 104 may be based on division of the cells into smaller resistance ranges to store more information, and to thereby create a higher-density memory. For example, the 4LC 102 may store two bits per cell (e.g., four ranges of resistance to represent bits $b_1$ and $b_0$), and the 8LC 104 may store three bits per cell (e.g., eight ranges of resistance to represent bits $b_2$, $b_1$, and $b_0$). The 4LC 102 and the 8LC 104 may store multiple bits by using a finer grained quantization of the cell resistance. Thus, the 4LC 102 and the 8LC 104 may be used to increase memory density, as more bits are stored in the same number of NVM cells.

As described in further detail with reference to FIG. 2, the versioned memory implementation disclosed herein provides for implementation of versioning capability in 2LC NVM. For example, a 2LC NVM memory bank may be decomposed into two sets (e.g., even and odd rows). The two sets of rows may be used to implement versioning capability in the 2LC NVM. As described in further detail herein, data may be copied through a row-buffer to thus reduce delays associated with transfer of data to an external memory controller. Versioning capability may also be implemented in the 2LC NVM by pairing of two rows in different memory banks (e.g., one row in a memory bank, and a co-located row in a different memory bank).

The versioned memory implementation disclosed herein may also provide for fine-grained data updates for both 2LC NVM and 4LC NVM. The fine-grained data updates may provide benefits, such as, for example, improvement in performance and energy efficiency of the NVM. According to an example, the fine-grained data updates may be provided by selectively changing part of a memory block, hereinafter denoted as a subblock. The fine-grained data updates may be implemented by using subblock-bit-vectors (SBVs) to track which subblocks are changed, and by using the subblocks and the SBVs for associated read, write, and other operations. For example, the SBVs may include bits that correspond to respective subblocks and further indicate which subblocks are changed based on changes to the bits. The versioned memory implementation techniques disclosed herein may also be used, for example, to implement fast checkpointing and fast data updates in NVM.

As described in further detail with reference to FIGS. 3-6, 8, 10, and 11, the versioned memory implementation disclosed herein may be used to read from a block (e.g., a block n) and a subblock (e.g., a subblock k) of the block for a checkpointing configuration. The checkpointing configuration may include a plurality of the memory blocks, with each memory block including a plurality of subblocks and a corresponding SBV to keep track of whether an individual subblock is changed. Reading from a block may include comparing a block version (BV) to a global version (GV). The BV may be associated with a memory block, and may represent a version number (e.g., a serial version number) of the respective memory block. The GV may store a global memory version number (e.g., a serial version number) representing the last checkpointed version of data stored in the memory block and other memory blocks. The checkpointing configuration may include a first level (e.g., a working version (WV)) and a second level (e.g., a checkpoint version (CV)). With respect to reading from a block, if $BV(n) \leq GV$, the read may be performed from the WV. Otherwise, for $BV(n) > GV$, the read may be performed from the WV or CV based on a failure procedure associated with the read operation as described herein.

As described in further detail with reference to FIGS. 3-6 and 9-11, the versioned memory implementation disclosed herein may be used to write to a block (e.g., a block n) and a subblock (e.g., a subblock k) of the block. For example, if $BV(n) < GV$, the write may be performed to the subblock as a first write by copying the $k^{th}$ WV subblock to the $k^{th}$ CV subblock, and writing new data into the $k^{th}$ WV subblock. If $BV(n) = GV$, the write may be performed to the subblock by evaluating the SBV, and writing the new data into the $k^{th}$ WV subblock based on the evaluation. If $BV(n) > GV$, the write may be performed to the subblock based on a failure procedure associated with the write operation as described herein.

As described in further detail with reference to FIGS. 3-7, the versioned memory implementation disclosed herein may be used for failure recovery. For example, recovery from failure may include decrementing the GV, re-executing a previous iteration, transaction, or program associated with the checkpointing configuration with the decremented GV; and before advancing the GV, scanning all BVs to determine if any BV is greater than GV, copying CV to WV, and setting the BV equal to the GV.

The versioned memory implementation disclosed herein may be used with applications that need versioning capabilities in memory systems. For example, the versioned memory implementation disclosed herein may be applicable to atomic and durable data updates to persistent data structures in NVM (e.g., NV-Heaps, MNEMOSYNE, consistent and durable data structures (CDDS), failure-atomic msync), NVM file systems (e.g., byte-addressable persistent file system (BPFS)), and in-memory checkpointing.

The versioned memory implementation disclosed herein may provide for checkpointing in computing systems, and may further provide consistent and durable data objects in NVM. According to an example, the checkpoint operations may be implemented by a versioned memory implementation apparatus, a method for versioned memory implementation, and/or a non-transitory computer readable medium having stored thereon machine readable instructions for versioned memory implementation. According to an example, versioned memory implementation may include comparing a global memory version to a block memory version. The global memory version may correspond to a plurality of memory blocks, and the block memory version may correspond to one of the plurality of memory blocks. A SBV corresponding to a plurality of subblocks of the one of the plurality of memory blocks may be evaluated. Based on the comparison and the evaluation, a determination may be made as to which level in a cell of one of the plurality of subblocks of the one of the plurality of memory blocks stores checkpoint data.

Figure 2:
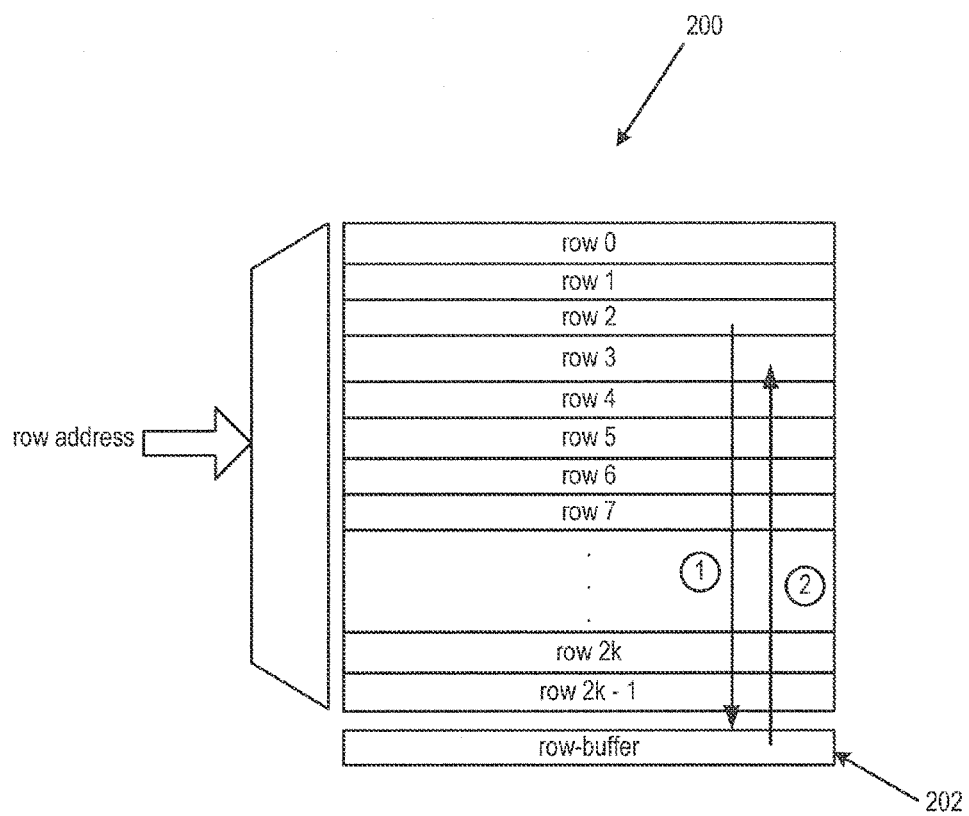
FIG. 2 illustrates a versioned memory using 2LC NVM, according to an example of the present disclosure.

FIG. 2 illustrates a versioned memory using 2LC NVM, according to an example of the present disclosure. The memory hank 200 of FIG. 2 may include, for example, 2k rows, where k is an integer greater than 0. The 2k rows may be divided into two sets of k rows, with the even rows being designated as working versions (WVS) and odd rows being designated as checkpoint versions (CVs) in versioned memory. Alternatively, the odd rows may be designated as WVs and the even rows may be designated as CVs in versioned memory. With respect to data copy from WV to CV, an example of a dataflow from WV (e.g., row 2) to CV (e.g., row3) illustrates data copy through a row-buffer 202. Data copy may also be performed based on a mapping between two data rows of a single memory bank (i.e., as shown in FIG. 2), or in different memory banks. For different memory banks, a WV may be designated as row x in a first memory bank, and the associated CV may be designated as row x in a second memory bank. For the example of the different memory banks, data copy from WV to CV may be performed by actual data transfer over a bus across memory banks. Compared to a versioned memory that relies on a NVM's 4LC capability (i.e., WV and CV (each N bits) in the same physical block (with N 2-bit cells)), a versioned memory using the 2LC NVM may use the same technique of addressing and version management as described in further detail below.

Figure 3:
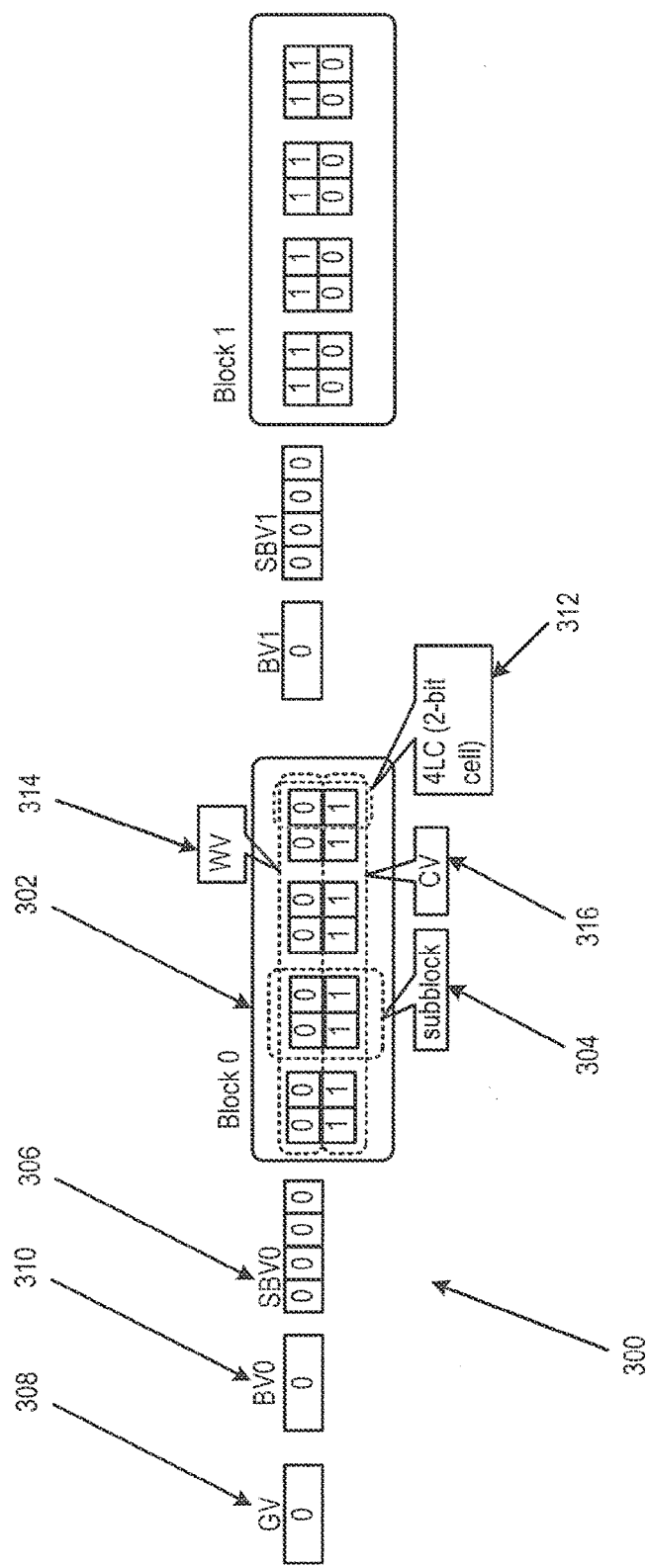
FIG. 3 illustrates a block diagram of a checkpointing configuration for a versioned memory with fine-grained data updates, according to an example of the present disclosure.

FIG. 3 illustrates a block diagram of a checkpointing configuration 300 for a versioned memory with fine-grained data updates, according to an example of the present disclosure. As shown in FIG. 3, the cells of a memory block 302 may be implemented using the two-bit per cell 4LC NVM of FIG. 1 (e.g., the NVM cell 102). Alternatively, the checkpointing configuration 300 may use 2LC NVM instead of 4LC NVM as discussed above with reference to FIG. 2. The checkpointing configuration 300 may include a plurality of the memory blocks 302 (note: two memory blocks 302 (block 0, and block 1) shown in FIG. 3), with each memory block 302 including a plurality of subblocks 304 and a corresponding subblock-bit-vector (SBV) 306 to keep track of whether a WV of an individual subblock is changed. The checkpointing configuration 300 may perform associated read, write, and other operations using the subblocks 304 and associated SBV 306, and an evaluation of a global version 308 and a block version (BV) 310 as described herein.

The GV 308 may correspond to the memory block 302 and other memory blocks (e.g., the block 1, and other memory blocks not shown). The GV 308 may store a global memory version number (e.g., a serial version number) representing the last checkpointed version of data stored in the memory block 302 and other memory blocks. The GV 308 may be part of a system state such that the GV 308 is managed, updated, and/or used in a memory as part of system control operations. For example, the GV 308 may be used to denote when the last checkpoint occurred. A checkpoint may be designated as a point during an operation of a memory at which checkpoint data used for recovery from errors, failures, and/or corruption is persisted in the memory. The GV 308 may be updated from time to time (e.g., periodically and/or aperiodically) based on a checkpointing instruction from an application performing calculations using the memory block 302 to indicate when a new checkpoint is to be stored. Additionally or alternatively, any other periodic and/or aperiodic approach to triggering creation of a checkpoint may be used. For example, a checkpoint may be created after every read and/or write operation, or a checkpoint may be created after a threshold amount of time (e.g., one minute, fifteen minutes, one hour, etc.). Additionally or alternatively, a checkpoint may be created when a collection of application data stored in memory is self-consistent. For example, for the self-consistent approach, the checkpoint may be created by beginning in a state in which the CV is consistent, temporarily disrupting and then restoring invariants to application data, checkpointing the data, creating a new consistent CV reflecting updates to the data, and, if needed, returning to the step of temporarily disrupting and then restoring invariants to application data. Although a single GV 308 is shown in connection with the memory block 302, multiple GVs 308 may be used to, for example, represent version numbers for different memory regions (e.g., a different GV may be used for one or more virtual address spaces such as, for example, for different processes, for one or more virtual machines, etc.). Further, any number of memory blocks having fewer or more memory cells having the same, fewer, or more levels may be associated with the GV 308 or different respective GVs.

The BV 310 may be associated with the memory block 302, and may represent a version number (e.g., a serial version number) of the respective memory block 302. For example, the BV0 of FIG. 3 represents the block 0. The By 310 may be stored in a separate memory object as metadata, where a memory object may be one or more memory blocks and/or locations storing data (e.g., the version number). BVs associated with different memory blocks may be stored in a same memory object.

For the checkpointing configuration 300, each subblock 304 may include two 2-bit cells 312, one of which is shown at reference numeral 312. However, in other examples, each subblock 304 may include any number of 2-bit cells. The 2-bit cell 312 may be a two-bit per cell 4LC (e.g., the NVM cell 102 of FIG. 1) having a first level 314 (e.g., a working version (WV)) and a second level 316 (e.g., a checkpoint version (CV)). Although the 4LC 312 is shown as a two-bit per cell 4LC, examples disclosed herein may be implemented in connection with 4LCs having more than two bits per cell (e.g., the 8LC 104). Further, while in the illustrated example the first level 314 is represented by the WV and the second level 316 is represented by the CV, any other levels may be used to represent the WV and/or the CV. For example, the levels may be reversed.

For the checkpointing configuration 300, the value of the BV 310 compared to the GV 308, and the value of a bit of the SBV 306 corresponding to a subblock 304 may be used to indicate whether data stored in the particular subblock 304 has been modified. For example, the BV 310 may be compared to the GV 308, and the bits of the SBV 306 may be evaluated to determine whether data stored in the WV or the CV of a corresponding subblock 304 represents checkpointed data.

The GV 308 and the BV 310 may be implemented, for example, using sixty-four bit counters to represent serial version numbers. When the GV 308 and/or the BV 310 are incremented beyond their maximum value, they roll back to zero.

Compared to a versioned memory design that uses a block (e.g., 4 kB) as a unit of data writes, the versioned memory represented by the checkpointing configuration 300 may provide for finer write granularity (e.g., 64B) even if the memory array still uses a larger (e.g., 4 kB) row buffer therein. In the example of FIG. 3, fine-grained data updates may be provided by dividing the blocks 302 (e.g., 4 kB blocks) into the subblocks 304 (e.g., 64 subblocks that are 64B each). To keep track of whether an individual subblock 304 is changed, the SBV 306 may include, for example, one bit per subblock 304 (e.g., a 64-bit SBV with 64B subblocks 304 per 4 kB block 302). In the example of FIG. 3, the blocks 302 are shown as 8-bit blocks, the subblocks 304 are shown as 2-bit subblocks, and the SBVs 306 are shown as 4-bit SBVs.

Figure 4:
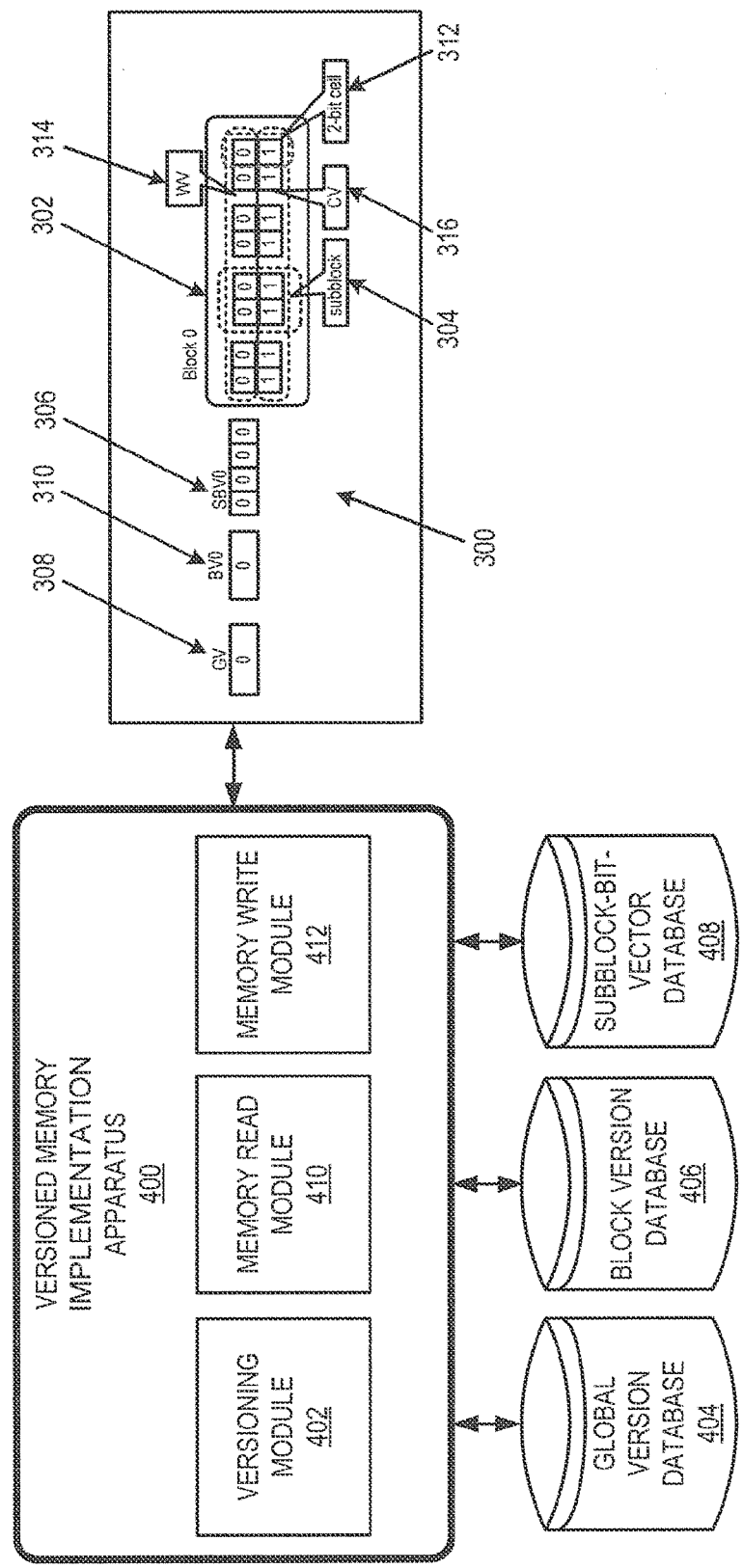
FIG. 4 illustrates a versioned memory implementation apparatus, according to an example of the present disclosure.

FIG. 4 illustrates a versioned memory implementation apparatus 400, according to an example. Referring to FIG. 4, the apparatus 400 is depicted as including a versioning module 402 to compare the GV 308 to the BV 310 for a 2LC or 4LC versioned NVM as illustrated by the checkpointing configuration 300. The GV 308 for each checkpointing configuration 300 may be stored in a global version database 404 that may include multiple GVs associated with different memory regions. The BVs 310 for each memory block 302 may be stored in a block version database 406. Further, the SBVs 306 may be stored in a subblock-bit-vector database 408. Alternatively or additionally, the GV 308 for each checkpointing configuration 300, the BVs 310 for each memory block 302, and/or the SBVs 306 may be stored along with data in the NVM as illustrated by the checkpointing configuration 300 (or the 2LC NVM). A memory read module 410 may read from the WV 314 or the CV 316 of a memory block 302 and/or a respective subblock 304 based on a comparison of the GV 308 and the BV 310 of the respective memory block 302, and an evaluation of a value of a bit of the SBV 306 corresponding to an appropriate subblock 304. A memory write module 412 may write to the WV 314 or the CV 316 of a memory block 302 and/or a respective subblock 304 based on a comparison of the GV 308 and the BV 310 of the respective memory block 302, and an evaluation of a value of a bit of BV 306 corresponding to an appropriate subblock 304.

The modules and other components of the apparatus 400 that perform various other functions in the apparatus 400, may comprise machine readable instructions stored on a non-transitory computer readable medium. In addition, or alternatively, the modules and other components of the apparatus 400 may comprise hardware or a combination of machine readable instructions and hardware. For example, the apparatus 400 may comprise a memory controller circuit to implement various operations of the apparatus 400.

The versioning module 402 may perform operations such as evaluation of and/or changes to the SBV 306, the GV 308, and the By 310. The versioning module 402 may determine if a checkpoint should be created. For example, the versioning module 402 may receive a request to create a checkpoint from an application, and create a checkpoint based on the received request. For example, the versioning module 402 may create the checkpoint after every read and/or write operation.

FIGS. 5A-5E respectively illustrate block diagrams of memory states 500, 502, 504, 506, and 508, during computations using the checkpointing configuration 300, according to an example of the present disclosure. The example of the memory states from 500 to 502, from 502 to 504, from 504 to 506, and from 506 to 508 shows a progression through time, and the durations between the different memory states may or may not be the same.

Referring to FIG. 5A, the initial memory state 500 of the memory block 302 may be represented by the GV 308 and the BV 310 set to zero, and where the WVs 314 of the memory cells (e.g., the memory cell 312) store the example data of [00 00 00 00]. In the example of FIG. 5A, the CVs 316 of the memory cells store the example data of [11 11 11 11].

Referring to FIG. 5B, the memory state 502 may represent the beginning of an execution period during which the GV 308 is incremented to one in response to the beginning of the execution period. For the memory state 502, the CVs 316 may remain at [11 11 11 11]. It should be noted that some bits in the SBV 306 may be 1 (e.g., [0 0 1 1] as shown in FIG. 5B) if the previous iteration of the checkpointing configuration 300 changed some of the subblocks 304. However, SBVs may be treated as being all 0's if the associated BV 310 is smaller than the GV 308.

Referring to FIG. 5C, the memory state 504 may represent an outcome of a first write operation that writes an example data value of [11] to the WVs 314 of second subblock 510 of the memory block 302 (i.e., block 0). For the write operation corresponding to the memory state 504, all bits in the SBV 306 (e.g., SBV0) may be updated (e.g., from [0 0 1 1] to [0 1 0 0]) based on the write operation corresponding to the second subblock 510 of the memory block 302. Because the GV 308 is greater than the BV 310 at the previous memory state 502 when the write operation is initiated, the data stored in the WVs 314 of the second subblock 510 during the memory state 502 may be written to the CVs 316 of the second subblock 510 as shown at the memory state 504. New data from the write operation initiated at the memory state 502 may be written in the WVs 314 of the second subblock 510 as shown at the memory state 504. The CVs 316 of the second subblock 510 and the WVs 314 of the first, third, and fourth subblocks may together store checkpointed data 512 (e.g., [00 00 00 00]), and the WVs 314 may store the newly written data (e.g., [00 11 00 00]). During the write operation, the BV 310 may be set to the value of the GV 308, thereby preventing subsequent writes that occur before the next checkpoint (as indicated by the GV 308 and BV 310 comparison) from overwriting the checkpointed data 512 (e.g., shaded data). Moreover, instead of updating the CVs 316 of all four subblocks in block 0 to [00], the fine-grained data updates provided by selectively updating a subblock 304 (e.g., the second subblock 510) provides for reduced energy and write bandwidth usage, and increased endurance for the versioned memory represented by the checkpointing configuration 300.

Referring to FIG. 5D, the memory state 506 may represent an outcome of a second write operation that writes an example data value of [11] to the WVs 314 of third subblock 514 of the memory block 302 (i.e., block 0). For the memory state 506, one bit in the SBV 306 (e.g., SBV0) may be updated (i.e., from [0 1 0 0] to [0 1 1 0]), since the BV 310 (e.g., the BV0) is already equal to the GV 308. The data stored in the WVs 314 of the third subblock 514 during the memory state 504 may be written to the CVs 316 of the third subblock 514 as shown at the memory state 506. New data from the write operation may be written in the WVs 314 of the third subblock 514 as shown at the memory state 506.

The CVs 316 of the second and third subblocks, and the WVs 314 of the first and fourth subblocks may together store the checkpointed data 512 (e.g., [00 00 00 00]) and the Ws 314 may store the newly written data (e.g., [00 11 11 00]). During the write operation, since the BV 310 is set to the value of the GV 308, this prevents subsequent writes that occur before the next checkpoint (as indicated by the GV 308 and BV 310 comparison) from overwriting the checkpointed data 512.

Figure 5E:
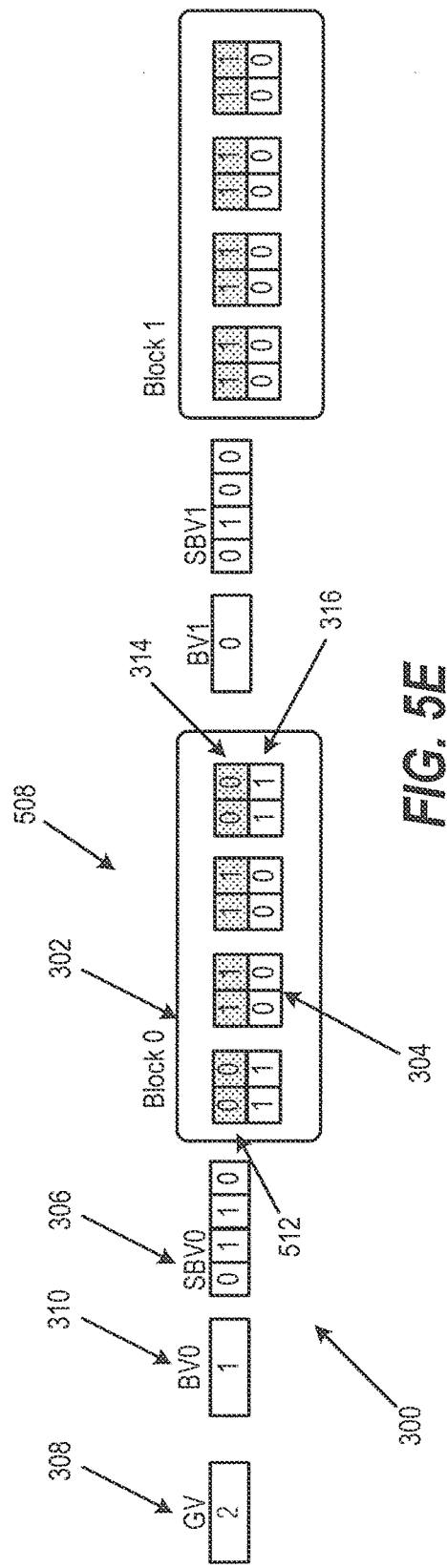

Referring to FIG. 5E, the memory state 508 may represent an outcome of a checkpointing operation. The checkpointing operation of FIG. 5E may occur at the end of the execution period of FIG. 5D. However, the checkpointing operation may occur at a point during the execution period (e.g., after an intermediate calculation has completed). The checkpointing operation may increment the GV 308 to a value of two. Further, the bits stored in the SBV 306 may be ignored (i.e., treated to be all 0's) when the BVs (e.g., the BV 310) are lower than the GV 308. The data stored in the WVs 314 immediately prior to the checkpointing operation may represent the most recent data (e.g., data written during a calculation). As such, when the GV 308 is greater than the BV 310, the checkpointed data 512 may be represented by the WVs 314. The CVs 316 may store outdated data from the previous checkpoint. The memory modifications used in the checkpointing operation may update the GV 308.

Figure 6:
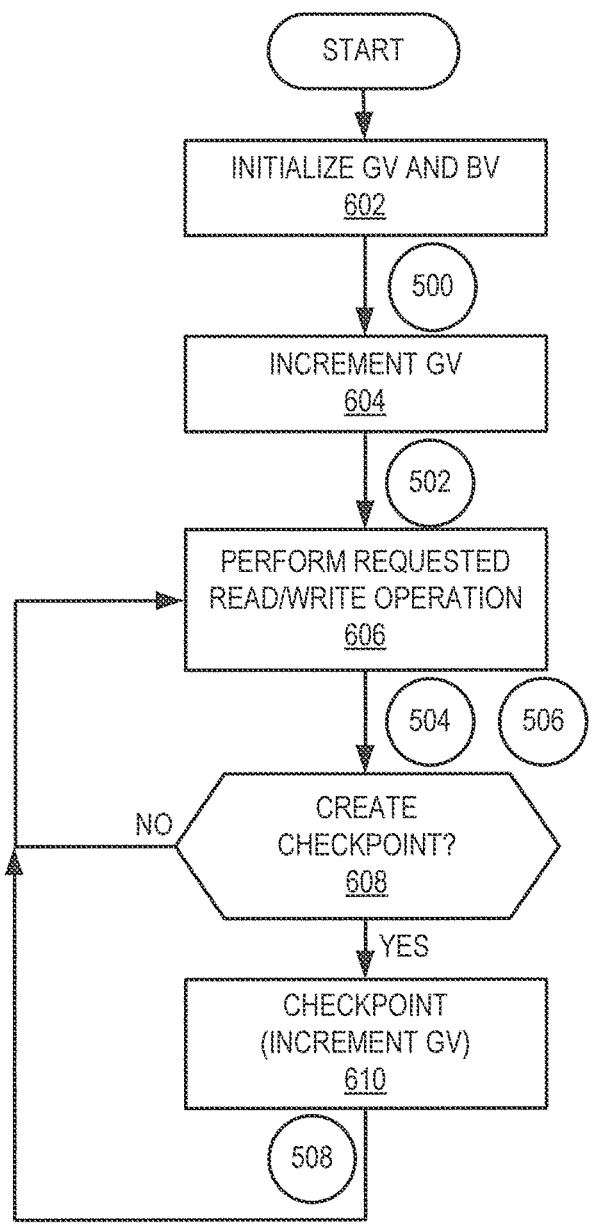
FIG. 6 illustrates a flowchart of operation sequences for the versioned memory implementation apparatus of FIG. 4 to perform the computations of FIGS. 5A-5E, according to an example of the present disclosure.

FIG. 6 illustrates a flowchart 600 of operation sequences for the versioned memory implementation apparatus 400 of FIG. 4 to perform the computations of FIGS. 5A-5E, according to an example of the present disclosure. Referring to FIG. 6, the circled reference numerals may denote the memory states of FIGS. 5A-5E at various points during the execution period. The operation sequence 600 may begin at block 604, and prior to block 604, the memory block 302 (see FIG. 3) may be at the memory state 500 of FIG. 5A at which no checkpointing has occurred. Because checkpointing has not yet occurred, the GV 308 and the BV 310 of FIG. 5A are zero.

At block 602, the versioning module 402 may initialize the GV 308 and the BV 310. In the memory state 500 of FIG. 5A, the GV 308 and the BV 310 may be set to zero, however any other value may be used.

At block 604, the versioning module 402 may increment the GV 308. By incrementing the GV 308, a subsequent write operation (e.g., the memory state 504) to the memory block 302 may cause the data stored in the WV 314 of a particular subblock 304 (e.g., the second subblock 510) to be stored in the corresponding CV 316 as checkpoint data 512. A memory state representing the incremented GV 308 prior to read and/or write operations is shown in the example memory state 502 of FIG. 5B. At the memory state 502, the versioning module 402 may treat the SBVs as being all 0's if the associated BV 310 is smaller than the GV 308.

At block 606, the versioned memory implementation apparatus 400 may perform a requested read and/or write operation on a subblock 304 of the memory block 302. Read operations are discussed in further detail in with respect to FIG. 8. Write operations are discussed in further detail with respect to FIG. 9.

Referring to FIG. 5C and block 606, a first write request may be received and processed. The outcome of the first write request is shown in memory state 504 of FIG. 5C. The first write request may indicate new data (e.g., [11]) to be written to the WVs 314 of the second subblock 510 of the memory block 302 (e.g., block 0). Based on a comparison of the GV 308 and the BV 310, the versioning module 402 may cause the memory read module 410 to read the WVs 314 of the second subblock 510 and the memory write module 412 to write the data read from the WVs 314 of the second subblock 510 to the corresponding CVs 316. The memory write module 410 may write the new data to the WVs 314 of the second subblock 510. The versioning module 402 may set the BV 310 equal to the GV 308. The versioning module 402 may further update all bits in the SBV 306 (e.g.; SBV0), for example, from [0 0 1 1] to [0 1 0 0], which is the result of first clearing all the SBV bits and then setting the bit corresponding to the subblock being updated, based on the write operation corresponding to the second subblock 510 of the memory block 302.

At block 608, the versioning module 402 may determine if a checkpoint should be created. Referring to the example of FIGS. 5A-5E, a checkpoint may be created in response to a received checkpoint request. For example, the versioning module 402 may receive a request to create a checkpoint from an application that requests the read and/or write operations of block 606. Additionally or alternatively, any other periodic and/or aperiodic approach to triggering creation of a checkpoint may be used. For example, the versioning module 402 may create the checkpoint after every read and/or write operation, or the versioning module 402 may create the checkpoint after an amount of time (e.g., one minute, fifteen minutes, one hour, etc.).

If the versioning module 402 is not to create a checkpoint, control returns to block 606 where the versioned memory implementation apparatus 400 may perform another requested read and/or write operation on a subblock 304 of the memory block 302. In the example of FIG. 5D and at block 606, a second write request may be received and processed. The outcome of the second write request is shown in the memory state 506 of FIG. 5D. The second write request may indicate new data to be written to the third subblock 514. Because the first write operation set the BV 310 equal to the GV 308, the versioning module 402 may cause the memory write module 412 to write the data to the WV 314 of the third subblock 514. The versioning module 402 may set the BV 310 equal to the GV 308. Further, the versioning module 402 may update one bit in the SBV 306 (e.g., SBV0 from [0 1 0 0] to [0 1 1 0]), setting the bit corresponding to the newly updated subblock, since the BV 310 (e.g., the BV0) is already equal to the GV 308.

At block 610, when a checkpoint is to be created, the versioning module 402 may increment the GV 308. An example outcome of the incrementation of the GV 308 is shown in the memory state 508 of FIG. 5E. Control may then proceed to block 606 where a first subsequent (e.g., the next) write operation causes the versioned memory implementation apparatus 400 to copy the data from the WV 314 to the CV 316 (e.g., as in the example memory state of 504) to persist as the checkpoint data 512.

Figure 7:
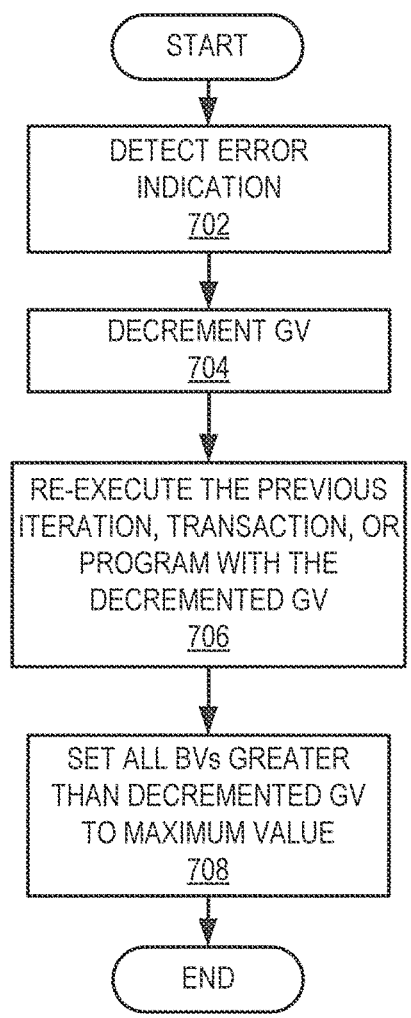
FIG. 7 illustrates a flowchart of operation sequences for the versioned memory implementation apparatus of FIG. 4 to recover from an error, according to an example of the present disclosure.

FIG. 7 illustrates a flowchart 700 of operation sequences for the versioned memory implementation apparatus 400 to recover from an error (e.g., a failure, a fault, etc.), according to an example of the present disclosure.

At block 702, the versioning module 402 may detect an error indication. For example, the error indication may be received from an application performing calculations on the data in the memory block 302 and/or a subblock 304. However, any other way of detecting the error indication may additionally or alternatively be used such as, for example, detecting when a system error has occurred, detecting an application crash, etc.

At block 704, when the error indication is detected, the versioning module 402 may decrement the GV 308 (e.g., the previous GV value). For example, the GV 308 may be set to zero, or alternatively, any other value may be used in response to an error. By decrementing the GV 308, all the corrupted memory blocks 302 have BVs>GV, and for those corrupted blocks 302 and/or subblock 304, the CV 316 may be considered correct data, and the WV 314 may be considered corrupted data.

At block 706, the versioning module 402 may re-execute the previous iteration, transaction, or program associated with the checkpointing configuration 300 with the decremented GV 308.

At block 708, the versioning module 402 may then inspect the BVs 310 associated with each memory block 302 and/or subblock 304, and set each BV 310 whose value is greater than the GV 308 (after decrementing) to the GV 308.

After the versioning module 402 resets the GV 308 and the BV 310, subsequent read operations may read data from the CVs 316 of the appropriate subblock 304. Further, subsequent write operations may write data to the WVs 314 of the appropriate subblock 304, and set the BV 310 to a value of the GV 308. The previous iteration, transaction, or program may be re-executed with the decremented GV 308. Any corrupted blocks 302 may be recovered to normal states as the versioned memory implementation apparatus 400 reads and writes to/from the corrupted blocks 302 (e.g., see the case when BVn>GV in read and write operations with reference to FIGS. 8 and 9). Further, before advancing the GV 308, all BVs 310 may be scanned, and if a BV 310 is greater than the GV 308, the CV 316 may be copied to the WV 314, and the BV 310 may be set equal to the GV 308.

Figure 8:
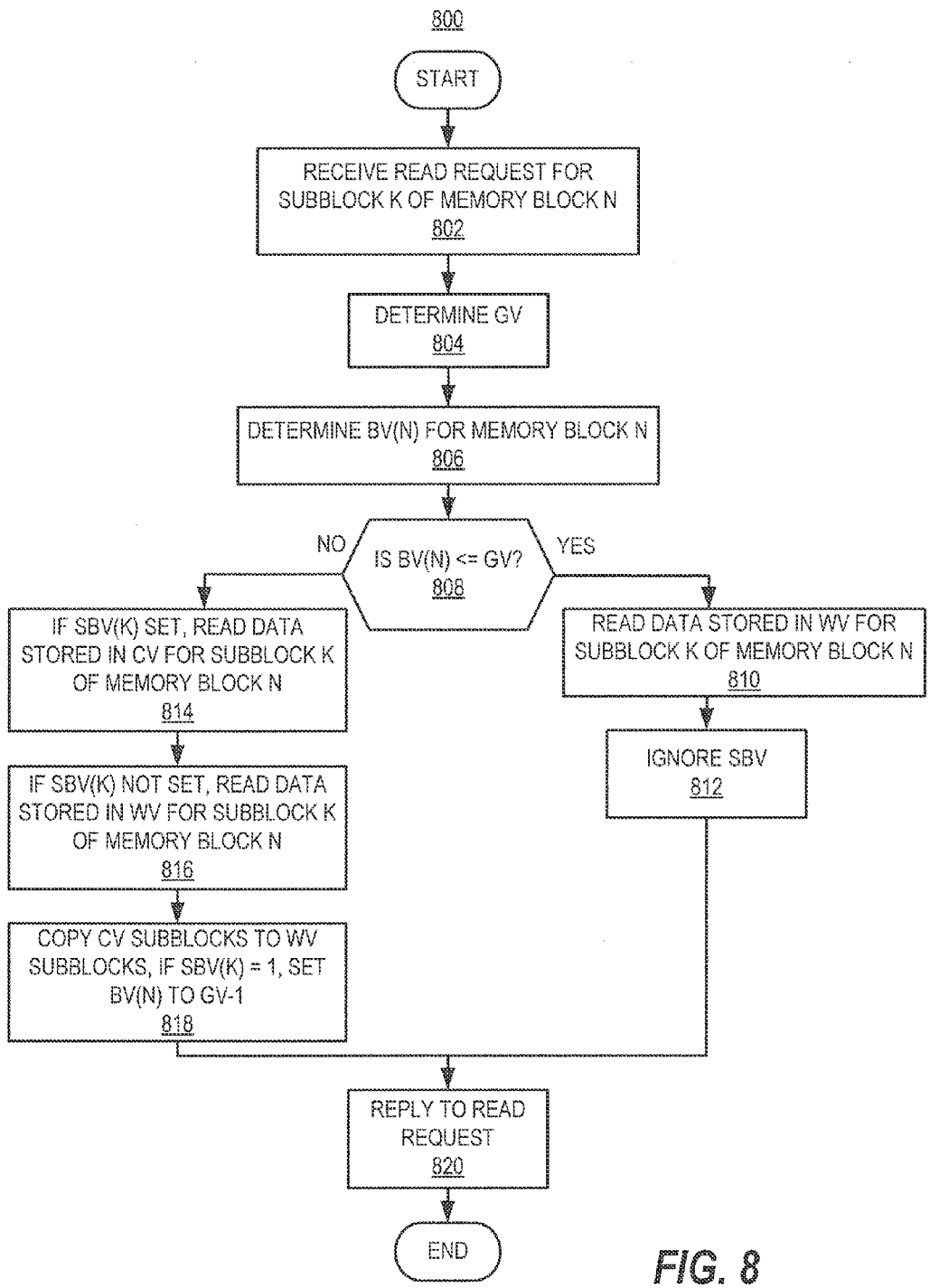
FIG. 8 illustrates a flowchart of operation sequences for the versioned memory implementation apparatus of FIG. 4 to perform a read operation, according to an example of the present disclosure.

FIG. 8 illustrates a flowchart 800 of operation sequences for the versioned memory implementation apparatus 400 to perform a read operation, according to an example of the present disclosure.

At block 802, the versioned memory implementation apparatus 400 may receive a read request for a particular subblock 304 (e.g., subblock k) of the memory block 302 (e.g., memory block n).

At block 804, the versioning module 402 may determine the GV 308. For example, the versioning module 402 may determine the GV 308 by reading the GV 308 from the global version database 404.

At block 806, the versioning module 402 may determine the BV 310 (e.g., BV(n)) associated with the memory block 302 (e.g., memory block n). For example, the versioning module 402 may determine the BV 310 by reading the BV 310 from the block version database 406.

At block 808, the versioning module 402 may compare the GV 308 to the BV 310 for the particular memory block 302 (e.g., memory block n) to identify which level of the appropriate subblock 304 (e.g., subblock k) should be read. For example, the versioning module 402 may determine that a first layer of the appropriate subblock 304 (e.g., the WVs 314) should be read when the BV 310 is determined to be less than or equal to the GV 308 (i.e., if (BV(n)<=GV)).

At block 810, if the BV 310 is determined to be less than or equal to the GV 308, the memory read module 410 may read the data stored in the first layer (e.g., the WVs 314) of the appropriate subblock 304 (e.g., subblock k).

At block 812, if the BV 310 is determined to be less than or equal to the GV 308, the SBV 306 may be ignored.

At block 814, if the versioning module 402 determines that the BV 310 is greater than the GV 308, the versioning module 402 may generate an indication of a failure. If the SBV 306 (e.g., SBV(k)) for the appropriate subblock 304 (e.g., subblock k) is set, the memory read module 410 may read the data stored in a second layer (e.g., the CVs 316) of the appropriate subblock 304 (e.g., subblock k).

At block 816, if the SBV 306 (e.g., SBV(k)) for the appropriate subblock 304 (e.g., subblock k) is not set, the memory read module 410 may read the data stored in a first layer (e.g., the WVs 314) of the appropriate subblock 304 (e.g., subblock k).

At block 818, for the subblocks where the SBV 306 is set, the versioning module 402 may copy the CVs 316 for the appropriate subblock 304 (e.g., subblock k) to the WVs 314 for the appropriate subblock 304 (e.g., subblock k) if SBV (k) is 1, and then set BV(n) to GV−1.

At block 820, once the memory read module 410 has read the data from the appropriate subblock 304 (e.g., subblock k) of the block 302 (e.g., memory block n), the versioned memory implementation apparatus 400 may reply to the read request with the data.

Figure 9:
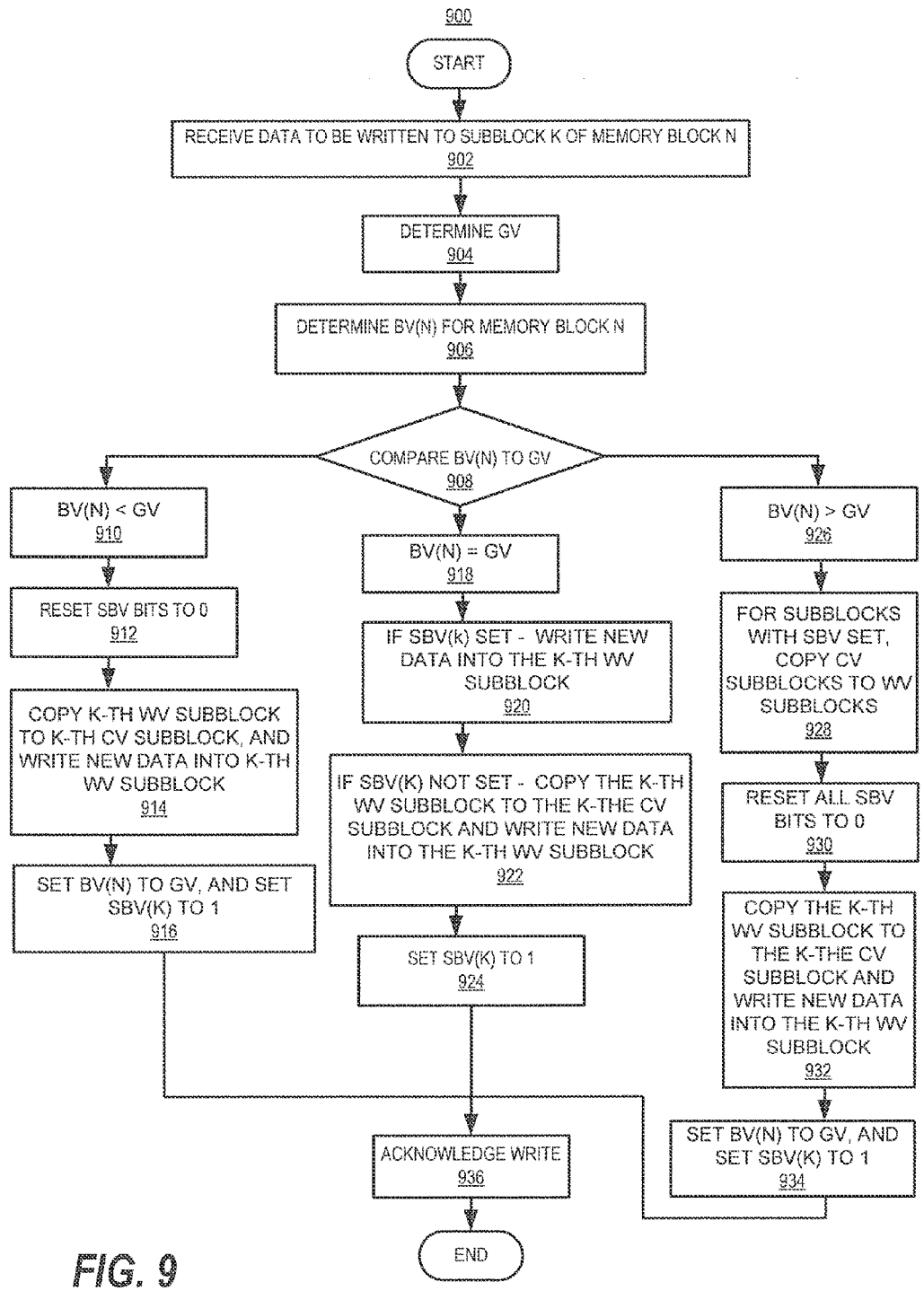
FIG. 9 illustrates a flowchart of operation sequences for the versioned memory implementation apparatus of FIG. 4 to perform a write operation, according to an example of the present disclosure.

FIG. 9 illustrates a flowchart 900 of operation sequences for the versioned memory implementation apparatus 400 to perform a write operation, according to an example of the present disclosure.

At block 902, the versioned memory implementation apparatus 400 may receive a write request for a particular subblock 304 (e.g., subblock k) of the memory block 302 (e.g., memory block n). The write request may include an address of the memory block 302, the particular subblock 304, and data to be written to the particular subblock 304.

At block 904, the versioning module 402 may determine the GV 308. For example, the versioning module 402 may determine the GV 308 by reading the GV 308 from the global version database 404.

At block 906, the versioning module 402 may determine the BV 310 (e.g., BV(n)) associated with the memory block 302 (e.g., memory block n). For example, the versioning module 402 may determine the BV 310 by reading the BV 310 from the block version database 406.

At block 908, the versioning module 402 may compare the GV 308 to the BV 310 to identify which level of the memory block 302 to which the received data should be written.

At block 910, the versioning module 402 determines that the BV 310 (e.g., BV(n)) for the memory block 302 (e.g., memory block n) is less than the GV 308 (i.e., BV(n)<GV).

At block 912, based on the determination at block 910, the versioning module 402 may reset all the SBV 306 bits for the memory block 302 (e.g., memory block n) to 0.

At block 914, the memory write module 412 may copy the WVs 314 for the appropriate subblock 304 (e.g., subblock k) to the CVs 316 for the appropriate subblock 304 (e.g., subblock k), and write new data into the WVs 314 for the appropriate subblock 304 (e.g., subblock k).

At block 916, the versioning module 402 may set the By 310 (e.g., BV(n)) for the memory block 302 (e.g., memory block n) to the GV 308. Further, the versioning module 402 may set the SBV 306 (e.g., SBV(k)) for the appropriate subblock 304 (e.g., subblock k) to one.

At block 918, the versioning module 402 determines that the BV 310 (e.g., BV(n)) for the memory block 302 (e.g., memory block n) is equal to the GV 308 (i.e., BV(n)=GV).

At block 920, if the versioning module 402 determines that the SBV 306 (e.g., SBV(k)) for the appropriate subblock 304 (e.g., subblock k) is set (i.e., already dirty), then the memory write module 412 may write the new data into the WVs 314 for the appropriate subblock 304 (e.g., subblock k), and the CVs 316 for the appropriate subblock 304 (e.g., subblock k) may remain unchanged.

At block 922, if the versioning module 402 determines that the SBV 306 (e.g., SBV(k)) for the appropriate subblock 304 (e.g., subblock k) is not set (i.e., is not dirty), then the memory write module 412 may copy the WVs 314 for the appropriate subblock 304 (e.g., subblock k) to the CVs 316 for the appropriate subblock 304 (e.g., subblock k), and write the new data to the WVs 314 for the appropriate subblock 304 (e.g., subblock k).

At block 924, the versioning module 402 may set the SBV 306 (e.g., SBV(k)) for the appropriate subblock 304 (e.g., subblock k) to one.

At block 926, the versioning module 402 determines that the By 310 (e.g., BV(n)) for the memory block 302 (e.g., memory block n) is greater than the GV 308 (i.e., BV(n) >GV). Further, based on the determination that the BV 310 is greater than the GV 308, the versioning module 402 may generate an indication of a failure.

At block 928, for all the subblocks with the SBV 306 set, the memory write module 412 may copy the CVs 316 for the appropriate subblock 304 to the WVs 314 for the appropriate subblock 304.

At block 930, the versioning module 402 may reset all SBV 306 bits to zero.

At block 932, the memory write module 412 may copy the WVs 314 for the appropriate subblock 304 (e.g., subblock k) to the CVs 316 for the appropriate subblock 304 (e.g., subblock k), and write the new data to the WVs 314 for the appropriate subblock 304 (e.g., subblock k).

At block 934, the versioning module 402 may set the BV 310 (e.g., BV(n)) for the memory block 302 (e.g., memory block n) to the GV 308. Further, the versioning module 402 may set the SBV 306 (e.g., SBV(k)) for the appropriate subblock 304 (e.g., subblock k) to one.

At block 936, the versioned memory implementation apparatus 400 may acknowledge the write request.

Figure 10:
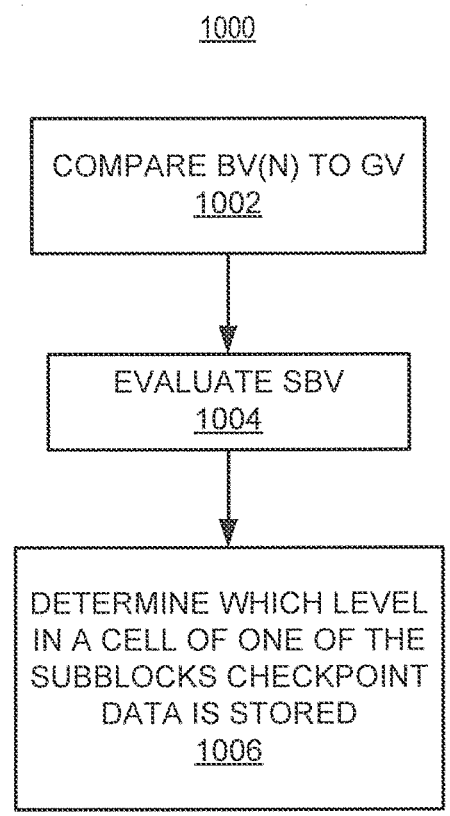
FIG. 10 illustrates a flowchart of a method for versioned memory implementation, according to an example of the present disclosure.
Figure 11:
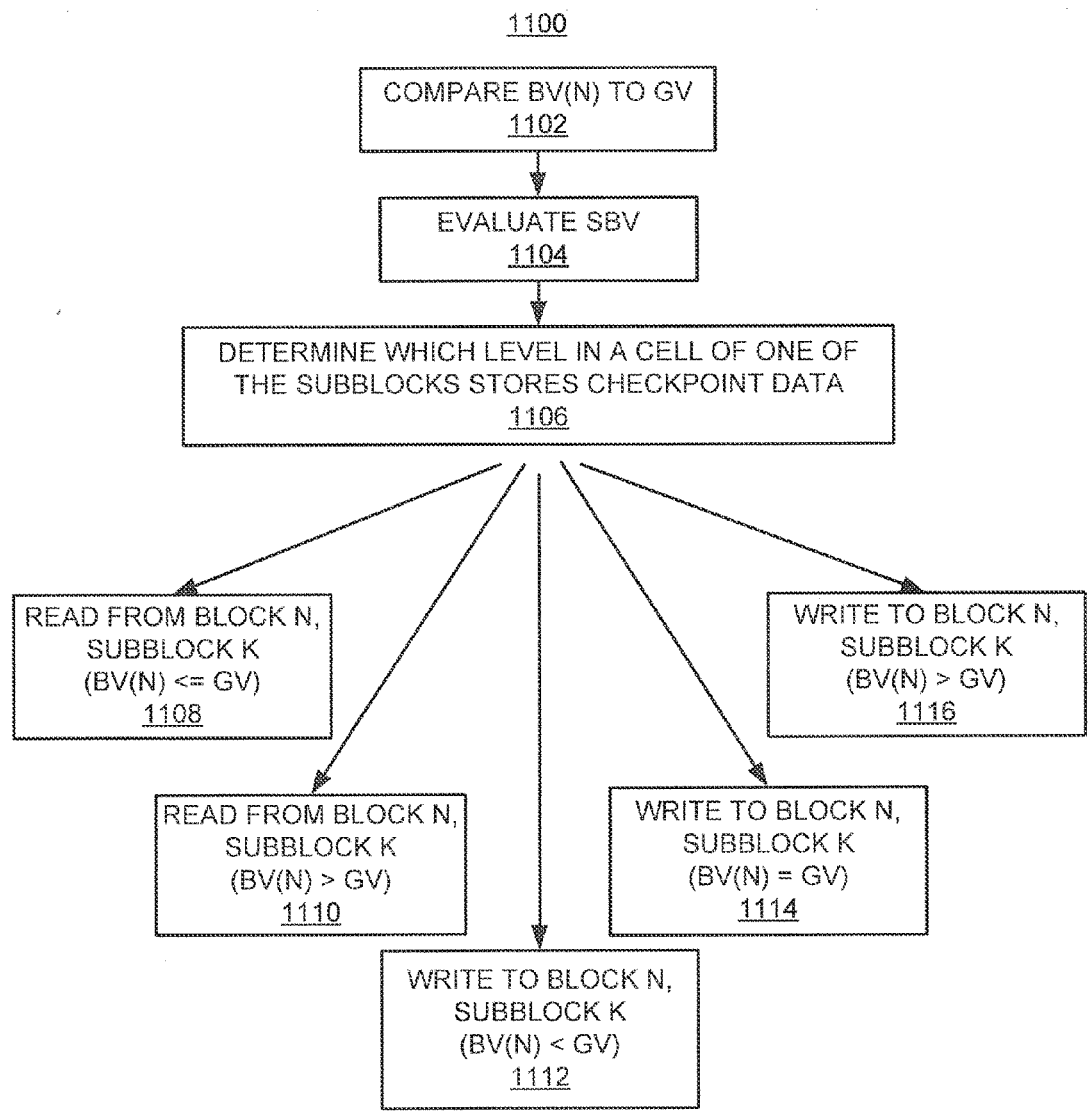
FIG. 11 illustrates further details of the flowchart of the method for versioned memory implementation, according to an example of the present disclosure.

FIGS. 10 and 11 respectively illustrate flowcharts of methods 1000 and 1100 for versioned memory implementation, corresponding to the example of the versioned memory implementation apparatus 400 whose construction is described in detail above. The methods 1000 and 1100 may be implemented on the versioned memory implementation apparatus 400 with reference to FIGS. 1-9 by way of example and not limitation. The methods 1000 and 1100 may be practiced in other apparatus.

Referring to FIG. 10, for the method 1000, at block 1002, a global memory version (e.g., value for the GV) may be compared to a block memory version (e.g., value for the BV(n)). The global memory version may correspond to a plurality of memory blocks, and the block memory version may correspond to one of the plurality of memory blocks.

At block 1004, a SBV corresponding to a plurality of subblocks of the one of the plurality of memory blocks may be evaluated.

At block 1006, based on the comparison and the evaluation, a determination may be made as to which level in a cell of one of the plurality of subblocks of the one of the plurality of memory blocks checkpoint data is stored.

Referring to FIG. 11, for the method 1100, at block 1102, a global memory version (e.g., value for the GV) may be compared to a block memory version (e.g., value for the BV(n)). The global memory version may correspond to a plurality of memory blocks, and the block memory version may correspond to one of the plurality of memory blocks.

At block 1104, a SBV corresponding to a plurality of subblocks of the one of the plurality of memory blocks may be evaluated.

At block 1106, based on the comparison and the evaluation, a determination may be made as to which level in a cell of one of the plurality of subblocks of the one of the plurality of memory blocks checkpoint data is stored.

At block 1108, the versioned memory implementation may include receiving instructions (e.g., at the versioned memory implementation apparatus 400) to read data from a subblock (e.g., subblock k) of the one of the plurality of memory blocks (e.g., memory block n), determining if the block memory version is less than or equal to the global memory version, and based on the determination that the block memory version is less than or equal to the global memory version, reading from a WV of the subblock.

At block 1110, the versioned memory implementation may include receiving instructions (e.g., at the versioned memory implementation apparatus 400) to read data from a subblock (e.g., subblock k) of the one of the plurality of memory blocks (e.g., memory block n), determining if the block memory version is greater than the global memory version, and based on the determination that the block memory version is greater than the global memory version, further determining if a value for the SBV corresponding to the subblock is set. Based on the determination that the value for the SBV corresponding to the subblock is set, the versioned memory implementation may include reading from a CV of the subblock. If the value for the SBV corresponding to the subblock is not set, and based on the determination that the value for the SBV corresponding to the subblock is not set, the versioned memory implementation may include reading from a WV of the subblock. Further, based on the determination that the block memory version is greater than the global memory version, the versioned memory implementation may include identifying subblocks of the one of the plurality of memory blocks for which corresponding values of the SBV are set, and for the identified subblocks copying the CV of the identified subblocks to the WV of the identified subblocks, and setting the block memory version to a previous global memory version.

At block 1112, the versioned memory implementation may include receiving instructions (e.g., at the versioned memory implementation apparatus 400) to write data to a subblock subblock k) of the one of the plurality of memory blocks (e.g., memory block n), determining if the block memory version is less than the global memory version, and based on the determination that the block memory version is less than the global memory version, resetting values of the SBV, copying the WV of the subblock to the CV of the subblock, and writing the received data into the WV of the subblock. Further, based on the determination that the block memory version is less than the global memory version, the versioned memory implementation may include setting the block memory version to the global memory version, and setting a value of the SBV corresponding to the subblock to a predetermined value.

At block 1114, the versioned memory implementation may include receiving instructions (e.g., at the versioned memory implementation apparatus 400) to write data to a subblock (e.g., subblock k) of the one of the plurality of memory blocks (e.g., memory block n), determining if the block memory version is equal to the global memory version, and based on the determination that the block memory version is equal to the global memory version, determining if a value of the SBV corresponding to the subblock is set, and based on the determination that the value of the SBV corresponding to the subblock is set, writing the received data into the WV of the subblock. Further, the versioned memory implementation may include receiving instructions to write data to a subblock of the one of the plurality of memory blocks, determining if the block memory version is equal to the global memory version, and based on the determination that the block memory version is equal to the global memory version, determining if a value of the SBV corresponding to the subblock is not set, and based on the determination that the value of the SBV corresponding to the subblock is not set copying the WV of the subblock to the CV of the subblock, and writing the received data into the WV of the subblock. Further, based on the determination that the value of the SBV corresponding to the subblock is not set, the versioned memory implementation may include setting a value of the SBV corresponding to the subblock to a predetermined value.

At block 1116, the versioned memory implementation may include receiving instructions (e.g., at the versioned memory implementation apparatus 400) to write data to a subblock (e.g., subblock k) of the one of the plurality of memory blocks (e.g., memory block n), determining if the block memory version is greater than the global memory version, and based on the determination that the block memory version is greater than the global memory version, identifying subblocks of the one of the plurality of memory blocks for which corresponding values of the SBV are set, and for the identified subblocks, copying the CV of the identified subblocks to the WV of the identified subblocks, setting values of the SBV to a predetermined value, copying the WV of the subblock to the CV of the subblock, and writing the received data into the WV of the subblock.

Figure 12:
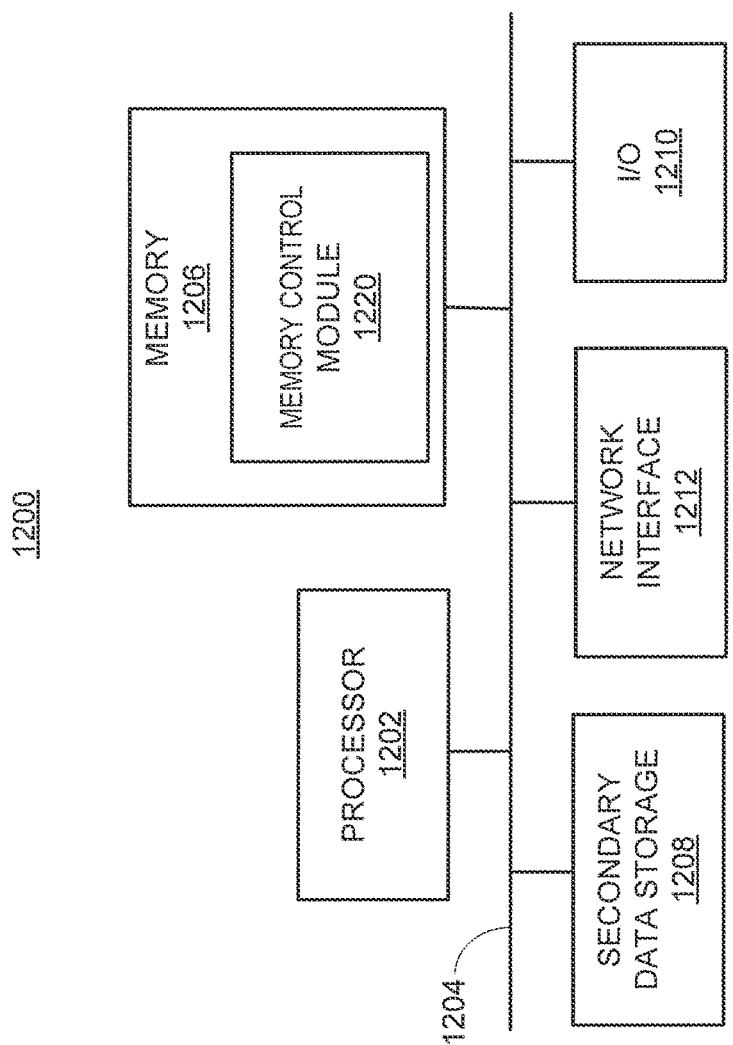
FIG. 12 illustrates a computer system, according to an example of the present disclosure.

FIG. 12 shows a computer system 1200 that may be used with the examples described herein. The computer system represents a generic platform that includes components that may be in a server or another computer system. The computer system 1200 may be used as a platform for the apparatus 400. The computer system 1200 may execute, by a processor or other hardware processing circuit, the methods, functions and other processes described herein. These methods, functions and other processes may be embodied as machine readable instructions stored on a computer readable medium, which may be non-transitory, such as hardware storage devices (e.g., RAM (random access memory), ROM (read only memory), EPROM (erasable, programmable ROM), EEPROM (electrically erasable, programmable ROM), hard drives, and flash memory).

The computer system 1200 includes a processor 1202 that may implement or execute machine readable instructions performing some or all of the methods, functions and other processes described herein. Commands and data from the processor 1202 are communicated over a communication bus 1204. The computer system also includes a main memory 1206, such as a random access memory (RAM), where the machine readable instructions and data for the processor 1202 may reside during runtime, and a secondary data storage 1208, which may be non-volatile and stores machine readable instructions and data. The memory and data storage are examples of computer readable mediums. The memory 1206 may include a versioned memory implementation module 1220 including machine readable instructions residing in the memory 1206 during runtime and executed by the processor 1202. The versioned memory implementation module 1220 may include the modules of the apparatus 400 shown in FIG. 4.

The computer system 1200 may include an I/O device 1210, such as a keyboard, a mouse, a display, etc. The computer system may include a network interface 1212 for connecting to a network. Other known electronic components may be added or substituted in the computer system.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. A method for versioned memory implementation, the method comprising:
comparing, by a processor, a global memory version to a block memory version, the global memory version corresponding to a plurality of memory blocks, and the block memory version corresponding to one of the plurality of memory blocks;
evaluating a subblock-bit-vector (SBV) corresponding to a plurality of subblocks of the one of the plurality of memory blocks; and
based on the comparison and the evaluation, determining in which level n a cell of one of the plurality of subblocks of the one of the plurality of memory blocks checkpoint data is stored.

2. The method of claim 1, wherein the cell is one of a 1-bit cell (2LC) and a 2-bit cell (4LC).

3. The method of claim 1, further comprising:
detecting an error state of data stored in the cell; and
reading the checkpoint data stored in the determined level in the cell to recover from the error state.

4. The method of claim 1, further comprising:
receiving instructions to read data from a subblock of the one of the plurality of memory blocks;
determining if the block memory version is less than or equal to the global memory version; and
based on the determination that the block memory version is less than or equal to the global memory version, reading from a working version (WV) of the subblock.

5. The method of claim 1, further comprising:
receiving instructions to read data from a subblock of the one of the plurality of memory blocks;
determining if the block memory version is greater than the global memory version; and
based on the determination that the block memory version is greater than the global memory version, further determining:
if a value for the SBV corresponding to the subblock is set, and based on the determination that the value for the SBV corresponding to the subblock is set, reading from a checkpoint version (CV) of the subblock,
if the value for the SBV corresponding to the subblock is not set, and based on the determination that the value for the SBV corresponding to the subblock is not set, reading from a working version (WV) of the subblock,
identifying subblocks of the one of the plurality of memory blocks for which corresponding values of the SBV are set,
for the identified subblocks, copying the CV of the identified subblocks to the WV of the identified subblocks, and
setting the block memory version to a previous global memory version.

6. The method of claim 1, further comprising:
receiving instructions to write data to a subblock of the one of the plurality of memory blocks;
determining if the block memory version is less than the global memory version; and
based on the determination that the block memory version is less than the global memory version:
resetting values of the SBV,
copying the working version (WV) of the subblock to the checkpoint version (CV) of the subblock,
writing the received data into the WV of the subblock,
setting the block memory version to the global memory version, and
setting a value of the SBV corresponding to the subblock to a predetermined value.

7. The method of claim 1, further comprising:
receiving instructions to write data to a subblock of the one of the plurality of memory blocks;
determining if the block memory version is equal to the global memory version; and
based on the determination that the block memory version is equal to the global memory version:
determining if a value of the SBV corresponding to the subblock is set, and based on the determination that the value of the SBV corresponding to the subblock is set, writing the received data into the working version (WV) of the subblock.

8. The method of claim 1, further comprising:
receiving instructions to write data to a subblock of the one of the plurality of memory blocks;
determining if the block memory version is equal to the global memory version; and
based on the determination that the block memory version is equal to the global memory version:
determining if a value of the SBV corresponding to the subblock is not set, and based on the determination that the value of the SBV corresponding to the subblock is not set:
copying the working version (WV) of the subblock to the checkpoint version (CV) of the subblock,
writing the received data into the WV of the subblock, and
setting a value of the SBV corresponding to the subblock to a predetermined value.

9. The method of claim 1, further comprising:
receiving instructions to write data to a subblock of the one of the plurality of memory blocks;
determining if the block memory version is greater than the global memory version; and
based on the determination that the block memory version is greater than the global memory version:
identifying subblocks of the one of the plurality of memory blocks for which corresponding values of the SBV are set, and for the identified subblocks, copying the checkpoint version (CV) of the identified subblocks to the working version (WV) of the identified subblocks,
setting values of the SBV to a predetermined value,
copying the WV of the subblock to the CV of the subblock, and
writing the received data into the WV of the subblock.

10. A non-transitory computer readable medium having stored thereon machine readable instructions to provide versioned memory implementation, the machine readable instructions, when executed, cause a computer system to:
compare, by a processor, a global memory version to a block memory version, the global memory version corresponding to a plurality of memory blocks, and the block memory version corresponding to one of the plurality of memory blocks;
evaluate a subblock-bit-vector (SBV) corresponding to a plurality of subblocks of the one of the plurality of memory blocks;

based on the comparison and the evaluation, determine in which level in a cell of one of the plurality of subblocks of the one of the plurality of memory blocks checkpoint data is stored;
detect an error state of data stored in the cell; and
read the checkpoint data stored in the determined level in the cell to recover from the error state.

11. The non-transitory computer readable medium of claim 10, wherein the cell is one of a 1-bit cell (2LC) and a 2-bit cell (4LC).

12. A versioned memory implementation apparatus comprising:
a memory controller circuit to:
compare a global memory version to a block memory version, the global memory version corresponding to a plurality of memory blocks, and the block memory version corresponding to one of the plurality of memory blocks;
evaluate a subblock-bit-vector (SBV) corresponding to a plurality of subblocks of the one of the plurality of memory blocks; and
based on the comparison and the evaluation, determine in which level in a cell of one of the plurality of subblocks of the one of the plurality of memory blocks checkpoint data is stored.

13. The versioned memory implementation apparatus of claim 12, wherein the cell is one of a 1-bit cell (2LC) and a 2-bit cell (4LC).

14. The versioned memory implementation apparatus of claim 12, wherein the cell is a 1-bit cell (2LC), the memory controller circuit is further to:
divide rows of the 2LC into a plurality of sets;
designate one set of the plurality of sets as working versions (WVs);
designate another set of the plurality of sets as checkpoint versions (CVs); and
use the designated sets of the divided rows to implement versioned memory.

15. The versioned memory implementation apparatus of claim 14, wherein the memory controller circuit is further to:
copy data through a row buffer used with the 2LC.

* * * * *